(12) United States Patent
Nnewihe et al.

(10) Patent No.: US 8,587,311 B2
(45) Date of Patent: Nov. 19, 2013

(54) MULTI-CHANNEL BREAST MRI RADIO FREQUENCY RECEIVER COIL

(75) Inventors: Anderson Nnewihe, Palo Alto, CA (US); Brian Hargreaves, Menlo Park, CA (US); Bruce L. Daniel, Stanford, CA (US); Thomas Grafendorfer, Stanford, CA (US); Paul David Calderon, Castro Valley, CA (US); Fraser John Laing Robb, Aurora, OH (US)

(73) Assignees: General Electric Company, Schenectady, NY (US); The Board of Trustees of the Leland Stanford, Jr. University, Palo Alto, CA (US)

( * ) Notice: Subject to any disclaimer, the term of this patent is extended or adjusted under 35 U.S.C. 154(b) by 690 days.

(21) Appl. No.: 12/752,448

(22) Filed: Apr. 1, 2010

(65) Prior Publication Data

US 2011/0241683 A1    Oct. 6, 2011

(51) Int. Cl.
*G01V 3/00* (2006.01)

(52) U.S. Cl.
USPC ............................................... 324/318

(58) Field of Classification Search
USPC .................................. 324/300–322
See application file for complete search history.

(56) References Cited

U.S. PATENT DOCUMENTS

| | | | |
|---|---|---|---|
| 5,699,802 A * | 12/1997 | Duerr | 600/422 |
| 6,023,166 A * | 2/2000 | Eydelman | 324/318 |
| 6,850,065 B1 | 2/2005 | Fujita et al. | |
| 6,876,199 B2 | 4/2005 | Hardy et al. | |
| 7,084,631 B2 * | 8/2006 | Qu et al. | 324/318 |
| 7,187,174 B2 | 3/2007 | Iwadate et al. | |
| 7,282,915 B2 | 10/2007 | Giaquinto et al. | |
| 7,382,132 B1 * | 6/2008 | Mathew et al. | 324/318 |
| 7,386,338 B2 | 6/2008 | Hoppel et al. | |
| 7,394,251 B2 * | 7/2008 | Lin | 324/309 |
| 7,449,888 B1 * | 11/2008 | Malik et al. | 324/318 |
| 7,498,813 B2 * | 3/2009 | Giaquinto et al. | 324/318 |
| 7,570,054 B1 * | 8/2009 | Lin | 324/309 |
| 7,619,413 B2 * | 11/2009 | Wiggins et al. | 324/318 |
| 7,663,367 B2 * | 2/2010 | Wiggins | 324/318 |
| 7,683,620 B2 * | 3/2010 | Lin | 324/309 |
| 7,725,159 B2 * | 5/2010 | Guan et al. | 600/422 |
| 7,772,842 B2 * | 8/2010 | Gao et al. | 324/307 |
| 7,826,887 B2 * | 11/2010 | Driemel | 600/422 |
| 8,190,237 B2 * | 5/2012 | Driemel | 600/422 |
| 2008/0077005 A1 | 3/2008 | Piron et al. | |
| 2009/0149738 A1 | 6/2009 | Piron et al. | |

* cited by examiner

*Primary Examiner* — Dixomara Vargas
(74) *Attorney, Agent, or Firm* — Ziolkowski Patent Solutions Group, SC (57) ABSTRACT

A system and method for breast imaging is disclosed. The system is constructed as a modular RF coil system for an MR imaging apparatus and includes a fitted coil former constructed to have a shape and size so as to substantially conform to a breast of a patient to be imaged and a receiver coil array positioned on the fitted coil former and having a plurality of receiver coils arranged to form a coil array. At least one of a size of each of the plurality of receiver coils and a number of the plurality of receiver coils is based on a size of the fitted coil former. Based on its coil arrangement and its proximity to the breasts of the patient to be imaged, the receiver coil array of the modular RF coil system is capable of receiving MR data for parallel imaging.

19 Claims, 4 Drawing Sheets

MULTI-CHANNEL BREAST MRI RADIO FREQUENCY RECEIVER COIL

GOVERNMENT LICENSE RIGHTS

This invention was made with Government support under contracts RR009784 and EB009055 awarded by the National Institutes of Health. The Government has certain rights in this invention.

BACKGROUND OF THE INVENTION

The present invention relates generally to medical imaging systems and, more particularly, to a radio frequency (RF) receiver coil array for a magnetic resonance (MR) imaging system.

When a substance such as human tissue is subjected to a uniform magnetic field (polarizing field $B_0$), the individual magnetic moments of the spins in the tissue attempt to align with this polarizing field, but process about it in random order at their characteristic Larmor frequency. If the substance, or tissue, is subjected to a magnetic field (excitation field $B_1$) which is in the x-y plane and which is oscillating at a radio frequency that is near the Larmor frequency, the net aligned moment, or "longitudinal magnetization", $M_Z$, may be rotated, or "tipped", into the x-y plane to produce a net transverse magnetic moment $M_t$. A signal is emitted by the excited spins after the excitation signal $B_1$ is terminated and this signal may be received and processed to form an image.

When utilizing these signals to produce images, magnetic field gradients ($G_x$, $G_y$, and $G_z$) are employed. Typically, the region to be imaged is scanned by a sequence of measurement cycles in which these gradients vary according to the particular localization method being used. The resulting set of nuclear magnetic resonance (NMR) signals are received by a RF coil array and subsequently digitized and processed to reconstruct the image using one of many well known reconstruction techniques. With respect to the RF coil array, MR systems often include a dedicated receiver coil array that is integrated into a patient table or formed as a separate surface coil, with the receiver coil array comprising a two-dimensional array formed from a plurality of coils.

One imaging procedure for which a dedicated receiver coil array is typically employed is breast imaging. The majority of dedicated receiver coil arrays currently used for breast imaging employ an "open" coil design in order to accommodate for interventional procedures during an imaging procedure. That is, most commercially available breast coils are constructed so as to provide a physician at least one of lateral and medial access to the breasts of an imaging patient, such that a breast biopsy can be performed during the imaging procedure. Due to the open design, these breast coils sacrifice signal-to-noise ratio (SNR) and parallel imaging capability in order to allow for accessibility to the breast. Such commercially available breast coils are comprised of larger coil elements, which leads to a bigger noise volume, reducing the SNR.

Several commercially available "closed" coil designs also exist for breast imaging, where the coils are constructed to substantially surround the breast, thereby not providing access to the breasts during imaging. However, such coil designs use a one-size-fits-all policy where the coils are oversized so as to fit larger size breasts. Such closed coils are inefficient for imaging small and medium breasts, as the breasts of a patient may be separated from the coils by a distance large enough to affect image quality, such as by reducing the SNR.

For both the existing open and closed breast coil designs, inefficiencies exist due to the design of the coil. That is, limitations of the coil geometry in such coils regarding how closely the coils can be placed relative to the breasts of the patient lead to reduced SNR and capability of parallel image acceleration in only one dimension. This leads to reduced image quality and increased scan time.

It would therefore be desirable to have a receiver coil array for breast imaging where the coils are placed closer to the breast, so as to increase SNR. It would also be desirable that such a coil array provide for parallel image acceleration in two dimensions, so as to reduce scan time and provide as much spatial independence of the coils as possible, so as to enable the highest possible parallel imaging acceleration factors to be used.

BRIEF DESCRIPTION OF THE INVENTION

The present invention provides a modular radio frequency (RF) receiver coil array for a magnetic resonance (MR) imaging system. The receiver coil array is modular in nature in that fitted coil formers and coil arrangements are selected based on the breast size of the patient to be imaged, such that the fitted coil formers and the coil arrangements are placed closer to the breast than in conventional coil systems. The receiver coil array thus provides breast imaging with increased SNR, reduced scan time, and/or higher spatial resolution images for patients of various breast sizes.

In accordance with one aspect of the invention, a modular radio frequency (RF) coil system for a magnetic resonance (MR) imaging apparatus includes a fitted coil former constructed to have a shape and size so as to substantially conform to a breast of a patient to be imaged and a receiver coil array positioned on the fitted coil former and having a plurality of receiver coils arranged to form a coil array, with at least one of a size of each of the plurality of receiver coils and a number of the plurality of receiver coils being based on a size of the fitted coil former. The receiver coil array is capable of receiving MR data for parallel imaging.

In accordance with another aspect of the invention, a method of constructing a modular radio frequency (RF) coil system includes providing a fitted coil former constructed to substantially conform to a breast of a patient to be imaged and determining a construction of a modular receiver coil arrangement to be positioned on the fitted coil former based on a size of the fitted coil former, wherein determining the construction of the modular receiver coil arrangement further includes determining a number of receiver coils to be included in the receiver coil arrangement and determining a size of each of the number of receiver coils. The method also includes positioning the modular receiver coil arrangement on the fitted coil former, with the modular receiver coil arrangement having the determined number of receiver coils of determined size, such that the modular receiver coil arrangement substantially covers a surface area of the fitted coil former.

In accordance with yet another aspect of the invention, a radio frequency (RF) coil assembly for a magnetic resonance (MR) imaging apparatus includes a top panel having a pair of openings formed therein and a fitted coil base positioned in each of the pair of openings, with each fitted coil base constructed to generally conform to a breast of a patient. The RF coil assembly also includes a modular receiver coil arrangement removably positioned on each of the fitted coil bases and arranged to form a hexagonal coil array, wherein each of the modular receiver coil arrangements is constructed so as to substantially cover a surface area of its respective fitted coil base and conform to a shape thereof such that each modular receiver coil arrangement is configured to surround a respective breast of the patient when the respective breast is positioned in a respective fitted coil base.

Various other features and advantages of the present invention will be made apparent from the following detailed description and the drawings.

BRIEF DESCRIPTION OF THE DRAWINGS

The drawings illustrate embodiments presently contemplated for carrying out the invention.

In the drawings.

DETAILED DESCRIPTION

A modular RF receiver coil system is provided having a fitted coil former and receiver coil array that are sized based on the breast size of a patient to be imaged. The fitted coil former and receiver coil array are thus placed closer to the breast than conventional systems and conform closely thereto, so as to provide for increased signal-to-noise ratio (SNR) in acquired images as well as to maximize 2D parallel imaging acceleration in the superior/inferior and right/left directions.

Figure 1:
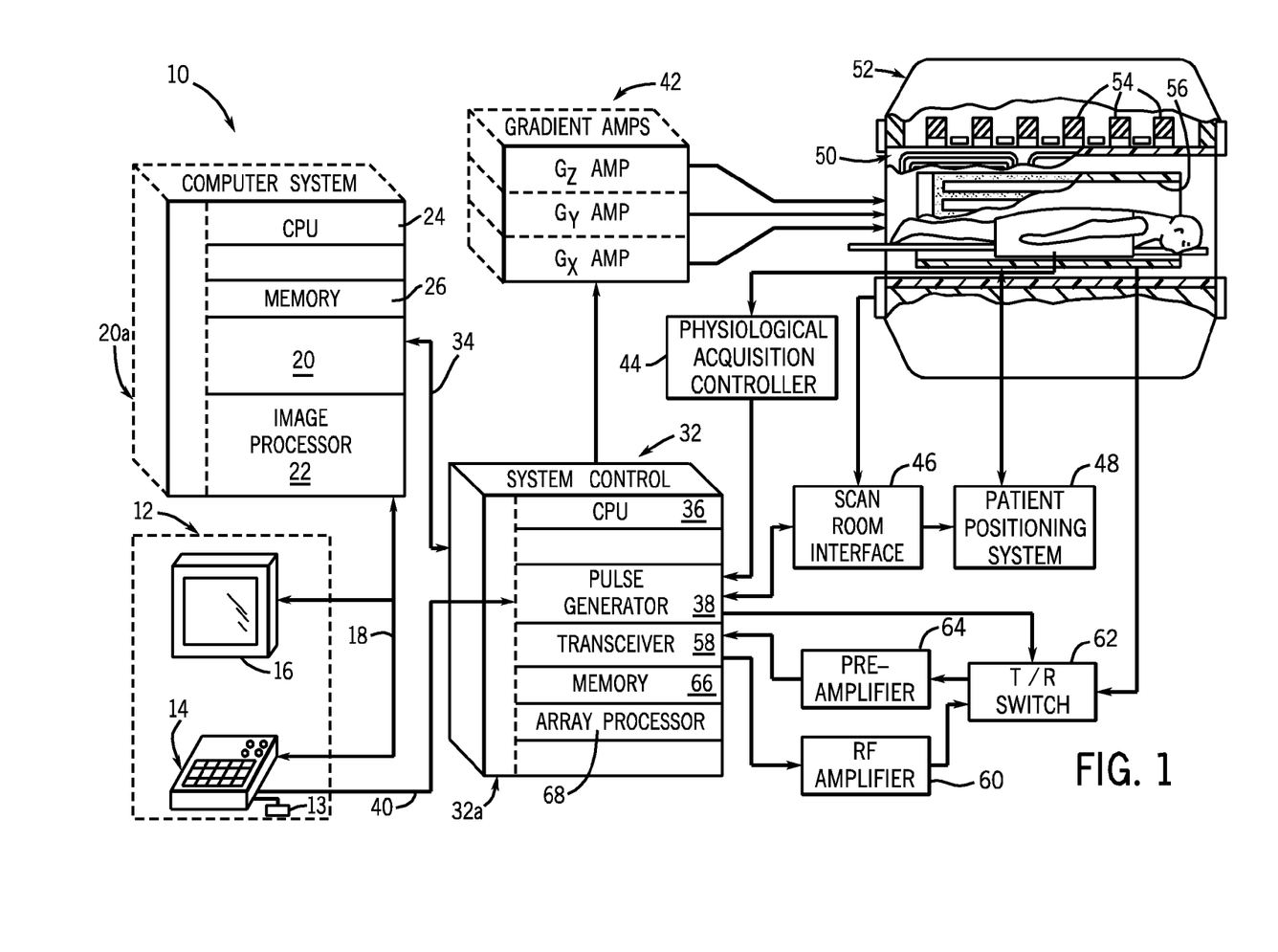
FIG. 1 is a schematic block diagram of an MR imaging system incorporating embodiments of the present invention.

Referring to FIG. 1, the major components of a magnetic resonance imaging (MRI) system 10 incorporating an embodiment of the invention are shown. The operation of the system is controlled from an operator console 12 which includes a keyboard or other input device 13, a control panel 14, and a display screen 16. The console 12 communicates through a link 18 with a separate computer system 20 that enables an operator to control the production and display of images on the display screen 16. The computer system 20 includes a number of modules which communicate with each other through a backplane 20a. These include an image processor module 22, a CPU module 24 and a memory module 26, which may include a frame buffer for storing image data arrays. The computer system 20 communicates with a separate system control 32 through a high speed serial link 34. The input device 13 can include a mouse, joystick, keyboard, track ball, touch activated screen, light wand, voice control, or any similar or equivalent input device, and may be used for interactive geometry prescription.

The system control 32 includes a set of modules connected together by a backplane 32a. These include a CPU module 36 and a pulse generator module 38 which connects to the operator console 12 through a serial link 40. It is through link 40 that the system control 32 receives commands from the operator to indicate the scan sequence that is to be performed. The pulse generator module 38 operates the system components to carry out the desired scan sequence and produces data which indicates the timing, strength and shape of the RF pulses produced, and the timing and length of the data acquisition window. The pulse generator module 38 connects to a set of gradient amplifiers 42, to indicate the timing and shape of the gradient pulses that are produced during the scan. The pulse generator module 38 can also receive patient data from a physiological acquisition controller 44 that receives signals from a number of different sensors connected to the patient, such as ECG signals from electrodes attached to the patient. And finally, the pulse generator module 38 connects to a scan room interface circuit 46 which receives signals from various sensors associated with the condition of the patient and the magnet system. It is also through the scan room interface circuit 46 that a patient positioning system 48 receives commands to move the patient to the desired position for the scan.

The gradient waveforms produced by the pulse generator module 38 are applied to the gradient amplifier system 42 having Gx, Gy, and Gz amplifiers. Each gradient amplifier excites a corresponding physical gradient coil in a gradient coil assembly generally designated 50 to produce the magnetic field gradients used for spatially encoding acquired signals. The gradient coil assembly 50 forms part of a resonance assembly 52 which includes a polarizing magnet 54 and a whole-body RF coil 56. A transceiver module 58 in the system control 32 produces pulses which are amplified by an RF amplifier 60 and coupled to the RF coil 56 by a transmit/receive switch 62. The resulting signals emitted by the excited nuclei in the patient may be sensed by the same RF coil 56 and coupled through the transmit/receive switch 62 to a preamplifier 64. The amplified MR signals are demodulated, filtered, and digitized in the receiver section of the transceiver 58. The transmit/receive switch 62 is controlled by a signal from the pulse generator module 38 to electrically connect the RF amplifier 60 to the coil 56 during the transmit mode and to connect the preamplifier 64 to the coil 56 during the receive mode. The transmit/receive switch 62 can also enable a separate RF coil (for example, a surface/volume coil) to be used in either the transmit or receive mode.

The MR signals picked up by the RF coil 56 are digitized by the transceiver module 58 and transferred to a memory module 66 in the system control 32. A scan is complete when an array of raw k-space data has been acquired in the memory module 66. This raw k-space data is rearranged into separate k-space data arrays for each image to be reconstructed, and each of these is input to an array processor 68 which operates to Fourier transform the data into an array of image data. This image data is conveyed through the serial link 34 to the computer system 20 where it is stored in memory. In response to commands received from the operator console 12, this image data may be archived in long term storage or it may be further processed by the image processor 22 and conveyed to the operator console 12 and presented on the display 16.

Figure 2:
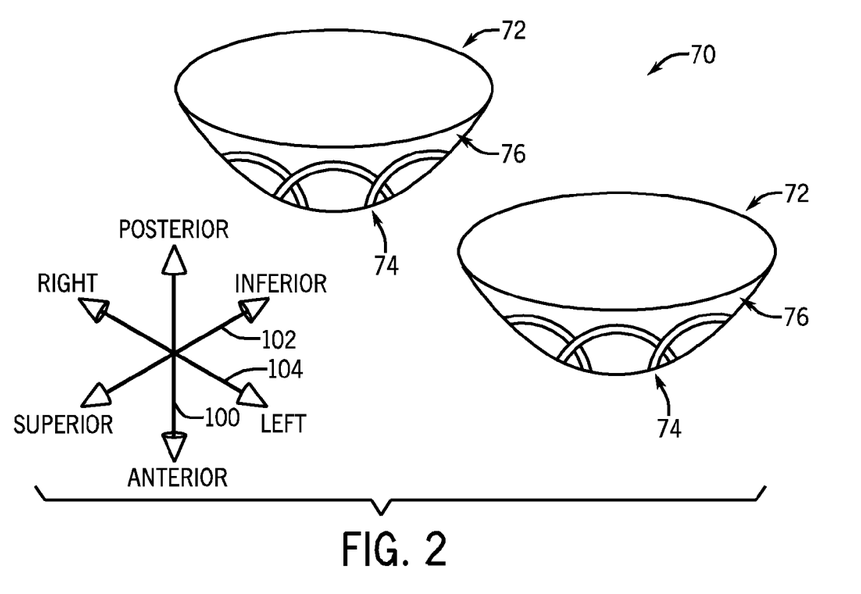
FIG. 2 is a perspective view of a modular RF receiver coil system according to an embodiment of the invention.

Referring to FIG. 2, a modular RF receiver coil system 70 (i.e., RF coil assembly) is depicted that is included in the MRI system 10 of FIG. 1, according to an embodiment of the invention. The modular receiver coil system 70 is configured to provide imaging of the breasts of a patient and includes a pair of fitted coil formers 72 (i.e., coil base) and a modular receiver coil arrangement 74 (i.e., receiver coil array) attached to a bottom or outer surface 76 of the fitted coil formers 72. The modular receiver coil system 70 thus provides two separate modular receiver coil arrangements 74: one set for the right breast and the other set for the left breast. Each modular receiver coil arrangement 74 can be used separately to achieve unilateral imaging for one of the two breasts of a patient. When both modular receiver coil arrangements 74 are used, bilateral imaging for both the breasts of a patient can be obtained.

Figure 3:
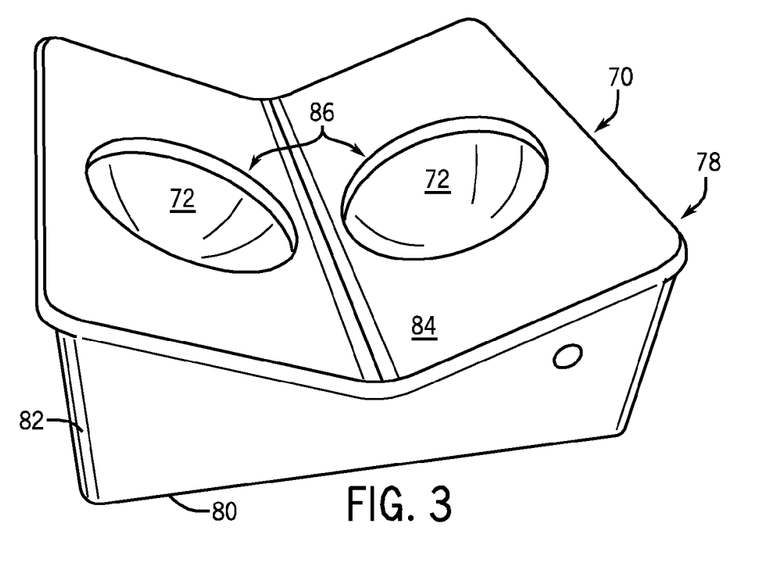
FIG. 3 is a perspective view of a modular RF receiver coil system according to an embodiment of the invention.

The MRI array coil system 70 is generally described as a "closed" system in that it is configured to not provide access to the breasts of the patient during MR image acquisition. This is as opposed to an "open" array coil system that includes coils designed to provide an easy and open access to the breasts of the patient for a surgeon to perform biopsy/interventional procedures during MR image acquisition. According to one embodiment of the invention, and as shown in FIG. 3, a box-type housing 78 is provided that includes bottom, side, and top panels 80, 82, 84 enclosing a space, with the top panel 84 having a pair of openings 86 formed therein. The openings 86 receive the pair of fitted coil formers 72 therein and allow for the pair of fitted coil formers 72 to be selectively added and removed, thereby providing for implementation of different sized coil formers 72 and modular receiver coil arrangements 74 to be seated in modular receiver coil system 70, as will be explained in greater detail below.

Referring again to FIG. 2, the fitted coil formers 72 are shown as being formed in the general shape of the breasts of a patient so as to accommodate positioning of breasts therein. The fitted coil formers 72 are formed of a non-magnetic material, such as a fiber-composite, for example, and are derived from the impression of the breasts of a woman on a thermoplastic mold, so as to give them a general breast-shaped configuration. The fitted coil formers 72 are constructed to substantially conform to the shape of breasts positioned therein of the patient to be imaged and thus it is recognized that the specified size of the fitted coil formers 72 in the modular receiver coil system 70 will vary based on the size of the breasts of the patient being imaged. That is, fitted coil formers 72 could be provided in a plurality of differing sizes, such as generally defined Small, Medium, and Large sizes, for example, according to one embodiment of the invention, or up to five or more distinct sizes so as to further increase the conformity of fitted coil formers 72 to the shape of breasts positioned therein. Prior to MR image acquisition for a given patient, it can be determined what size fitted coil formers 72 are desired based on the breast size of the patient, and fitted coil formers 72 having the specified size can be implemented in the modular receiver coil system 70 by positioning fitted coil formers 72 relative to one another, such as by placement in openings 86 of top panel 84 (FIG. 3).

As shown in FIG. 2, a modular receiver coil arrangement 74 is attached to each of the fitted coil formers 72 on the outer surface 76 thereof. The modular receiver coil arrangements 74 generally conform to the outer surface 76 of the fitted coil formers 72, such that the modular receiver coil arrangements 74 also have a generally breast-shaped configuration. Beneficially, this provides for modular receiver coil arrangements 74 that substantially conform to the shape of breasts positioned in fitted coil formers 72, thereby positioning modular receiver coil arrangements 74 close to the breasts of the patient.

Figure 4:
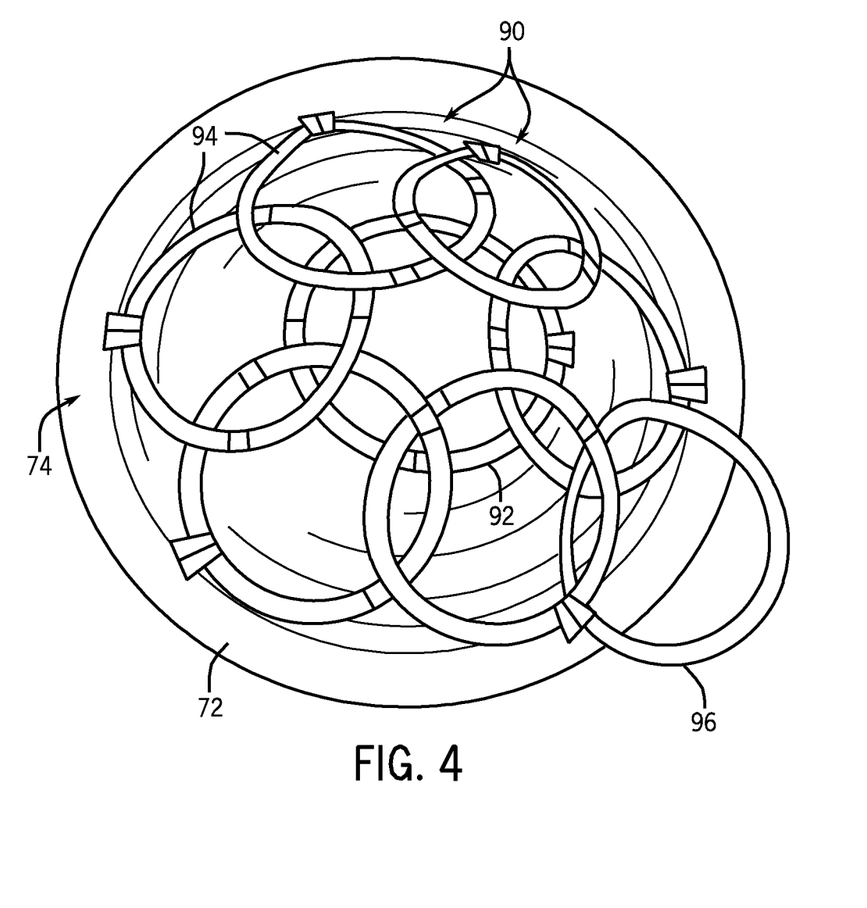
FIG. 4 is a bottom view of a modular RF receiver coil system according to an embodiment of the invention.

A more detailed view of a modular receiver coil arrangement 74 positioned on fitted coil former 72 is shown in FIG. 4, according to an embodiment of the invention. The modular receiver coil arrangement 74 includes a plurality of receiver coils 90. Receiver coils 90 are shown as having a circular shape, however, it is recognized that coils 90 could also be formed as square or octagonal shaped coils, or any other suitable shape. In general, the size of each of receiver coils 90 is minimized so as to allow for greater contouring/conforming of the coils 90 to fitted coil former 72 such that the coils 90 are positioned closer to the breast, so as to increase signal-to-noise ratio (SNR) of received MR signals.

According to embodiments of the invention, the receiver coil arrangement 74 is in the form of a "modular" coil arrangement in that the size of the individual receiver coils 90 and/or the number of receiver coils 90 in the receiver coil arrangement 74 can be varied based on the size of the fitted coil former 72 to which the arrangement is positioned on, which in turn is selected based on the size of the breasts of the patient to be imaged. That is, based on the size of fitted coil former 72 implemented in modular receiver coil system 70, a sufficient number and/or size of receiver coils 90 is provided in receiver coil arrangement 74 such that the coil arrangement 74 substantially covers the outer surface 76 of fitted coil former 72 so as to surround an interior volume of the fitted coil former 72 and provide adequate coverage about the breast of the patient. Thus, for example, modular coil arrangement 74 of modular receiver coil system 70 may include anywhere from four to thirty-two (or more) coil elements 90 (i.e., channels), with the number of coil elements 90 being limited only by the number of receivers provided on MRI system 10 (FIG. 1). It should be noted that the coil elements 90 are isolated from each other through geometric isolation and/or preamplifier decoupling and/or using transformers. Therefore, all the coil elements 90 of the modular coil arrangement 74 may be used simultaneously to provide imaging on a multi-channel MRI system.

According to an exemplary embodiment of the invention, the plurality of receiver coils 90 are arranged so as to minimize mutual inductance between neighboring coils via geometric overlap between neighboring coils. For example, according to an embodiment of the invention, each modular receiver coil arrangement 74 can be composed of eight receiver coils 90 positioned in a hexagonal arrangement, so as to form a 16-channel bilateral breast coil array. In such a hexagonal arrangement, each modular receiver coil arrangement 74 includes a center coil 92, a group of six coils 94 positioned about the center coil 92 in a hexagonal pattern and overlapping therewith, and an additional coil 96 positioned outside the group of six coils 94 so as to cover the upper outer quadrant of the interior volume of the fitted coil former 72 and an upper outer quadrant (axilla) of a breast. The hexagonal arrangement of receiver coils 90 provides for decoupling of center coil 92 via geometric overlap with the neighboring group of six coils 94. While a hexagonal arrangement of eight receiver coils 90 is shown in FIG. 4, it is recognized that a greater or lesser number of coils 90 could be included in receiver coil arrangement 74, and that other geometric overlapping patterns could be employed to minimize mutual inductance between neighboring coils. For example, additional coils can be positioned outside the group of six coils 94 (in addition to coil 96) to further increase coverage near the axillary tail of the breast.

It is recognized that it is desirable for receive coil system 70 to provide parallel imaging acceleration in more than one dimension, such that breast imaging scan times can be significantly reduced. Parallel imaging acceleration typically requires arrays of multiple receiver coils that surround the tissue of interest (i.e., breasts). Thus, an "open" arrangement of receiver coils for breast imaging and/or a "closed" arrangement of receiver coils positioned farther from the breasts provides very limited parallel imaging acceleration capability, if any at all. Beneficially, the structure of modular coil arrangements 74 of modular receiver coil system 70, and the contouring thereof on fitted coil formers 72 close to the breasts of the patient, provide for 2D parallel imaging acceleration. That is, the modular coil arrangements 74 utilize the plurality of receive coils 90 therein to acquire data from the tissue of interest (i.e., the breasts) and exploit the spatial dependence of phased array coil sensitivity to accelerate data acquisition in two dimensions.

Referring again to FIG. 2, three directions relative to an imaging patient are identified as an anterior/posterior direction 100, a superior/inferior direction 102, and a right/left direction 104. The structure of modular coil arrangements 74 and the contouring/closeness thereof relative to the breasts of the patient provide for 2D parallel imaging acceleration in the superior/inferior and right/left directions 102, 104, as opposed to conventional MR breast imaging in which only 1D parallel imaging acceleration is performed in the anterior/posterior direction 100. Upon 2D accelerated image acquisition in the superior/inferior and right/left directions 102, 104 by modular coil arrangements 74, known parallel imaging reconstruction techniques can be used to generate an image, such as SENSE-based techniques (Sensitivity Encoding), GRAPPA-based techniques (Generalized Auto-calibrating Partially Parallel Acquisition), or ARC-based techniques (Auto-calibrating Reconstruction for Cartesian sampling), for example.

Figure 5:
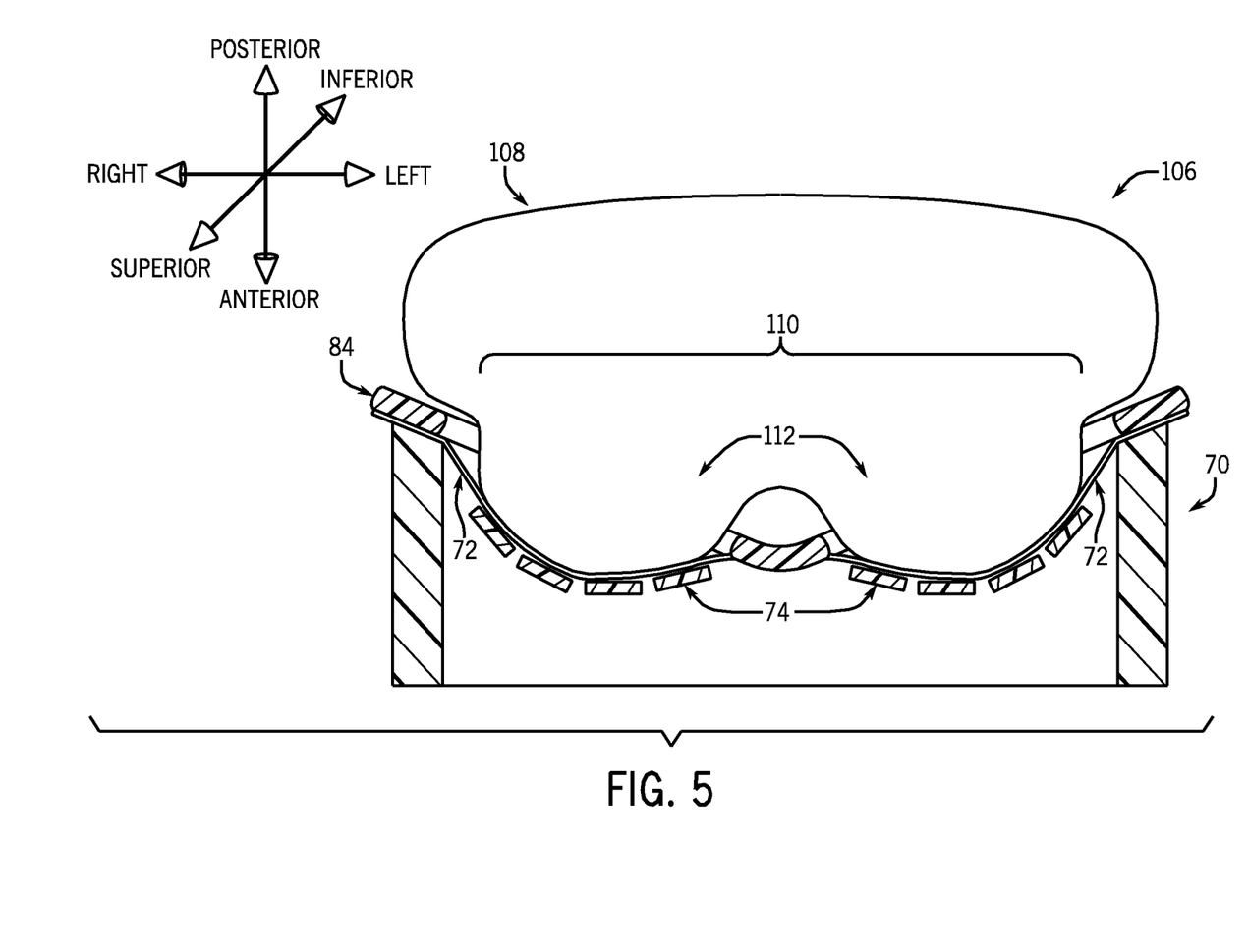
FIG. 5 is a front elevation view of the modular RF receiver coil system of FIG. 3 showing a torso therein.

Referring now to FIG. 5, a patient 106 is shown positioned in the modular receiver coil system 70. The patient 106 lies face downward (i.e., prone) on the modular receiver coil system 70, which provides support to the patient's torso 108, with a chest 110 of the patient torso 108 contacting or touching top panel 84 of the modular receiver coil system 70. It should be noted that the superior/inferior directions are out of and into the plane of FIG. 8, respectively. The fitted coil formers 72 positioned in openings 86 of the top panel 84 receive the breasts 112 of the patient torso 108. As set forth above, the size of fitted coil formers 72 (e.g., S, M, L) positioned in openings 86 can be determined prior to MR image acquisition based on the size of the breasts 112 of the patient 106, and properly sized coil formers 72 can be interchangeably added to modular receiver coil system 70 as needed. The selected coil formers 72 thus closely contour the breasts 112 without deforming them in any matter due to compression.

Coil arrangements 74 are affixed to the outer/bottom surface 76 of fitted coil formers 72 and are modularly constructed based on the selected coil formers 72 provided in modular receiver coil system 70. That is, based on the size of the breasts 112 of patient 106, and the corresponding size of coil formers 72 selected to properly receive breasts 112 therein in a generally conformal manner, modular coil arrangements 74 having a desired number of coils 90 of desired size are provided on coil formers 72. The selected modular coil arrangements 74 thus conform to coil formers 72 so as to be positioned adjacent to the breasts 112 of the patient 106 and substantially cover a surface area of the outer surface of the coil formers 72 so as to surround an interior volume of the fitted coil former 72 and surround the breasts 112. The structure of modular coil arrangements 74 and the contouring/closeness thereof relative to the breasts 112 thus provides for 2D parallel imaging acceleration in the superior/inferior and right/left directions, and further provide optimal SNR.

Beneficially, modular receiver coil system 70 is thus configured to provide breast imaging with increased SNR, reduced scan time, and/or higher spatial resolution images for patients of various breast sizes. The receiver coil system 70 is modular in nature in that fitted coil formers 72 and corresponding coil arrangements 74 can be selected based on the breast size of the patient to be imaged. Fitted coil formers 72 and coil arrangements 74 are thus placed closer to the breast than conventional systems and conform closely thereto, so as to provide for minimal noise in acquired images as well as 2D parallel imaging acceleration in the superior/inferior and right/left directions. Additionally, modular receiver coil system 70 provides for the breasts of the patient to be predominantly flattened against the chest wall. This minimizes the distance of the posterior breast to the coil arrangement 74, reduces bulk breast motion, and provides images of the breast in a position that more closely resemble the position of the breast during surgery.

Therefore, according to one embodiment of the invention, a modular radio frequency (RF) coil system for a magnetic resonance (MR) imaging apparatus includes a fitted coil former constructed to have a shape and size so as to substantially conform to a breast of a patient to be imaged and a receiver coil array positioned on the fitted coil former and having a plurality of receiver coils arranged to form a coil array, with at least one of a size of each of the plurality of receiver coils and a number of the plurality of receiver coils being based on a size of the fitted coil former. The receiver coil array is capable of receiving MR data for parallel imaging.

According to another embodiment of the invention, a method of constructing a modular radio frequency (RF) coil system includes providing a fitted coil former constructed to substantially conform to a breast of a patient to be imaged and determining a construction of a modular receiver coil arrangement to be positioned on the fitted coil former based on a size of the fitted coil former, wherein determining the construction of the modular receiver coil arrangement further includes determining a number of receiver coils to be included in the receiver coil arrangement and determining a size of each of the number of receiver coils. The method also includes positioning the modular receiver coil arrangement on the fitted coil former, with the modular receiver coil arrangement having the determined number of receiver coils of determined size, such that the modular receiver coil arrangement substantially covers a surface area of the fitted coil former.

According to yet another embodiment of the invention, a radio frequency (RF) coil assembly for a magnetic resonance (MR) imaging apparatus includes a top panel having a pair of openings formed therein and a fitted coil base positioned in each of the pair of openings, with each fitted coil base constructed to generally conform to a breast of a patient. The RF coil assembly also includes a modular receiver coil arrangement removably positioned on each of the fitted coil bases and arranged to form a hexagonal coil array, wherein each of the modular receiver coil arrangements is constructed so as to substantially cover a surface area of its respective fitted coil base and conform to a shape thereof such that each modular receiver coil arrangement is configured to surround a respective breast of the patient when the respective breast is positioned in a respective fitted coil base.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A modular radio frequency (RF) coil system for a magnetic resonance (MR) imaging apparatus comprising:
 a rigid fitted coil former constructed to have a shape and size so as to substantially conform to a breast of a patient to be imaged the rigid fitted coil former completely surrounding the breast when the breast is positioned therein so as to enclose the breast in the fitted coil former; and a modular receiver coil array selectively attachable to, and on the rigid fitted coil former and comprising a plurality of receiver coils arranged to form a coil array, with at least one of a size of each of the plurality of receiver coils and a number of the plurality of receiver coils being based on a size of the fitted coil former wherein the size and number of the plurality of receiver coils in the modular receiver coil array is such that modular receiver coil array has a generally breast-shaped configuration that substantially covers and conforms to the shape of the breast positioned in the fitted coil former; and wherein the receiver coil array is capable of receiving MR data for parallel imaging.

2. The modular RF coil system of claim 1 wherein the fitted coil former is constructed to have a specified size as determined by a size of the breast of the patient to be imaged.

3. The modular RF coil system of claim 2 wherein each of the plurality of receiver coils is constructed to have a specified size based on the fitted coil former being constructed to have the specified size as determined by a size of the breast of the patient to be imaged.

4. The modular RF coil system of claim 2 wherein the plurality of receiver coils comprises a desired number of receiver coils based on the size of the fitted coil former.

5. The modular RF coil system of claim 1 wherein the receiver coil array is configured to substantially cover a surface area of the fitted coil former so as to surround an interior volume of the fitted coil former.

6. The modular RF coil system of claim 1 wherein the receiver coil array is capable of receiving MR data for parallel imaging acceleration in at least one of an superior-inferior direction and an anterior-posterior direction.

7. The modular RE coil system of claim 6 wherein the receiver coil array is capable of receiving MR data for 2D parallel imaging parallel imaging acceleration in each of the superior-inferior direction and the anterior-posterior direction.

8. The modular RF coil system of claim 1 further comprising a closed housing having a pair of openings formed in a top panel thereof, wherein each of the pair of openings is configured to removably receive a respective fitted coil former.

9. The modular RF coil system of claim 1 comprising one of a single breast phased array coil system and a bilateral phased array coil system.

10. The modular RF coil system of claim 1 wherein the plurality of receiver coils comprises:
a center coil;
a group of coils arranged about the center coil such that each coil in the group of coils overlaps with the center coil and overlaps with each adjacent coil in the group of coils; and
at least one additional coil overlapping with the group of coils and positioned so as to cover an upper outer quadrant of the interior volume of the fitted coil former.

11. The modular RF coil system of claim 10 wherein the plurality of receiver coils are arranged to form a geometrically overlapping coil array.

12. The modular RF coil system of claim 1 wherein the fitted coil former is constructed as a closed coil former that is configured to not provide access to the breasts of the patient during MR image acquisition.

13. A method of constructing a modular radio frequency (RF) coil system comprising:

determining a breast size of a patient to be imaged; providing based on the determined breast size a rigid fitted coil former constructed to substantially conform to a breast of a patient to be imaged the fitted coil former being selected from a plurality of interchangeable rigid fitted coil formers of differing sizes;

determining a construction of a modular receiver coil arrangement to be positioned on the fitted coil former based on a size of the fitted coil former, wherein determining the construction comprises:
determining a number of receiver coils to be included in the receiver coil arrangement; and
determining a size of each of the number of receiver coils; and positioning the modular receiver coil arrangement on the fitted coil former, the modular receiver coil arrangement having the determined number of receiver coils of determined size, such that the modular receiver coil arrangement substantially covers a surface area of the fitted coil former.

14. The method of claim 13 further comprising arranging the determined number of receiver coils in the receiver coil arrangement in a geometrically overlapping hexagonal pattern, so as to provide for 2D parallel imaging acceleration in a superior-inferior direction and an anterior-posterior direction.

15. The method of claim 13 wherein providing the fitted coil former comprises providing a fitted coil former having one of a first size, a second size, and a third size based on a size of the breast of the patient to be imaged.

16. The method of claim 15 further comprising:
providing a closed housing having a pair of openings formed in a top panel thereof; and
positioning a fitted coil former having one of the first size, the second size, and the third size in each of the pair of openings such that the fitted coil formers are seated in the closed housing.

17. A radio frequency (RF) coil assembly for a magnetic resonance (MR) imaging apparatus comprising:
a top panel having a pair of openings formed therein;
a rigid fitted coil base positioned in each of the pair of openings, each fitted coil base constructed to generally conform to a breast of a patient with the fitted coil bases comprising components separate from the top panel and being selectively addable and removable from the pair of openings in the top panel, such that fitted coil bases of desired size that conform to the breasts of the patient can be selected from a plurality of interchangeable fitted coil bases of differing sizes and selectively positioned in the pair of openings; and
a modular receiver coil arrangement selectively attachable to each of the fitted coil bases and arranged to form a hexagonal coil array;
wherein each of the modular receiver coil arrangements is constructed so as to substantially cover a surface area of its respective fitted coil base and conform to a shape thereof such that each modular receiver coil arrangement is configured to surround a respective breast of the patient when the respective breast is positioned in a respective fitted coil base.

18. The RF coil assembly of claim 17 wherein the modular receiver coil arrangement comprises a plurality of receiver coils, and wherein at least one of a diameter of each of the plurality of receiver coils and a number of receiver coils in the plurality of receiver coils is based on a size of its respective fitted coil base.

19. The RF coil assembly of claim 17 wherein the modular receiver coil arrangement is configured to provide 2D parallel imaging acceleration for MR data acquisition in a superior-inferior direction and an anterior-posterior direction based on a positioning thereof relative to the breast of the patient and based on the hexagonal coil array of the modular receiver coil arrangement.

* * * * *

UNITED STATES PATENT AND TRADEMARK OFFICE
CERTIFICATE OF CORRECTION

PATENT NO.       : 8,587,311 B2                                                    Page 1 of 1
APPLICATION NO.  : 12/752448
DATED            : November 19, 2013
INVENTOR(S)      : Nnewihe et al.

It is certified that error appears in the above-identified patent and that said Letters Patent is hereby corrected as shown below:

In the Claims

Col. 9, line 5 (Claim 1), delete "on the rigid" and
substitute therefore -- positionable on the rigid --.

Signed and Sealed this
Eighth Day of April, 2014

Michelle K. Lee
*Deputy Director of the United States Patent and Trademark Office*